United States Patent [19]
Pettigrew

[11] Patent Number: 5,341,106
[45] Date of Patent: Aug. 23, 1994

[54] AMPLITUDE LOCKED LOOP CIRCUITS

[75] Inventor: Archibald M. Pettigrew, Kilmacolm, United Kingdom

[73] Assignee: The Governors of Paisley College of Technology, Paisley, United Kingdom

[21] Appl. No.: 910,347

[22] PCT Filed: Jan. 23, 1991

[86] PCT No.: PCT/GB91/00101
§ 371 Date: Jul. 22, 1992
§ 102(e) Date: Jul. 22, 1992

[87] PCT Pub. No.: WO91/11854
PCT Pub. Date: Aug. 8, 1991

[30] Foreign Application Priority Data

Jan. 23, 1990 [GB] United Kingdom ............ 9001538.9
Jan. 23, 1990 [GB] United Kingdom ............ 9001539.7
Oct. 5, 1990 [GB] United Kingdom ............ 9021703.5

[51] Int. Cl.$^5$ ............................ H03D 1/18; H04B 1/10
[52] U.S. Cl. ................................ 329/319; 329/325; 329/350; 329/353; 455/260; 455/312
[58] Field of Search ............... 329/319, 320, 325, 326, 329/347, 350, 353; 455/260, 312

[56] References Cited

U.S. PATENT DOCUMENTS 4,890,066 12/1989 Straver et al. ............... 455/312 X

FOREIGN PATENT DOCUMENTS 0316879 11/1988 European Pat. Off. .
1260347 9/1969 United Kingdom .
1568513 10/1976 United Kingdom .
2053599 6/1980 United Kingdom .
2081999 2/1982 United Kingdom ............ 329/350

OTHER PUBLICATIONS

Sato et al, "CO–4 IE's For High–Quality Demodulators For 4–Channel Discs" IEEE Transactions on Consumer Electronics, vol. CE-21, No. 3, Aug. 1975, pp. 195–202.

Primary Examiner—James B. Mullins
Attorney, Agent, or Firm—Ratner & Prestia

[57] ABSTRACT

There is described an electronic circuit which operates an Amplitude Locked Loop. The circuit comprises a voltage controlled amplifier, a modulus detector and an integrator combined in a feedback loop. An FM signal decoder is also described as are a number of applications of Amplitude Locked Loop.

2 Claims, 15 Drawing Sheets

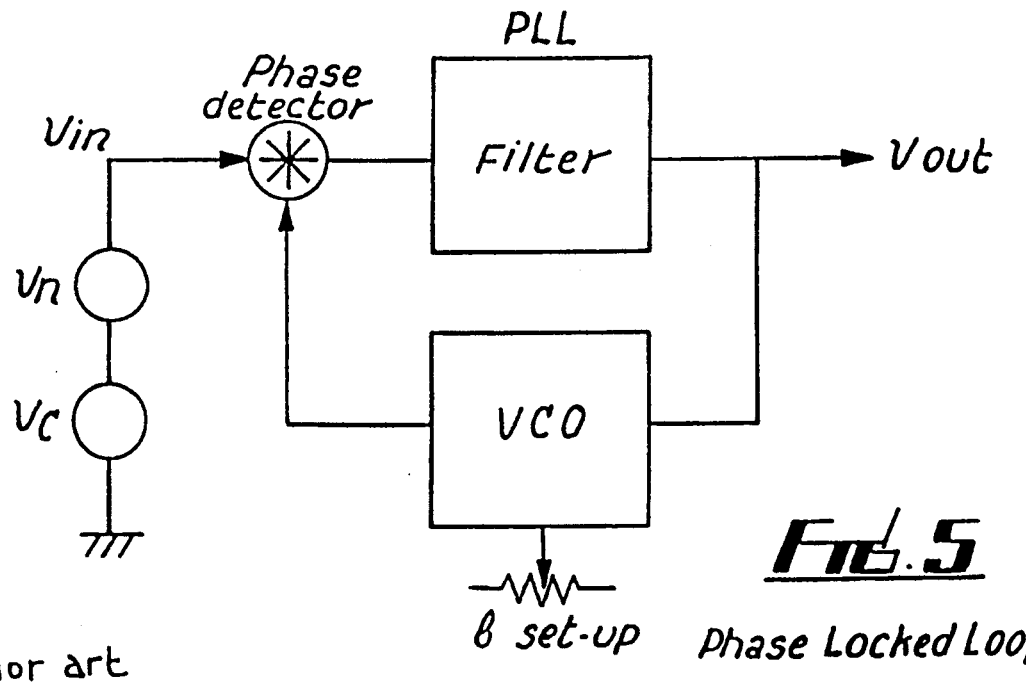
Fig. 5 Phase Locked Loop
Prior art
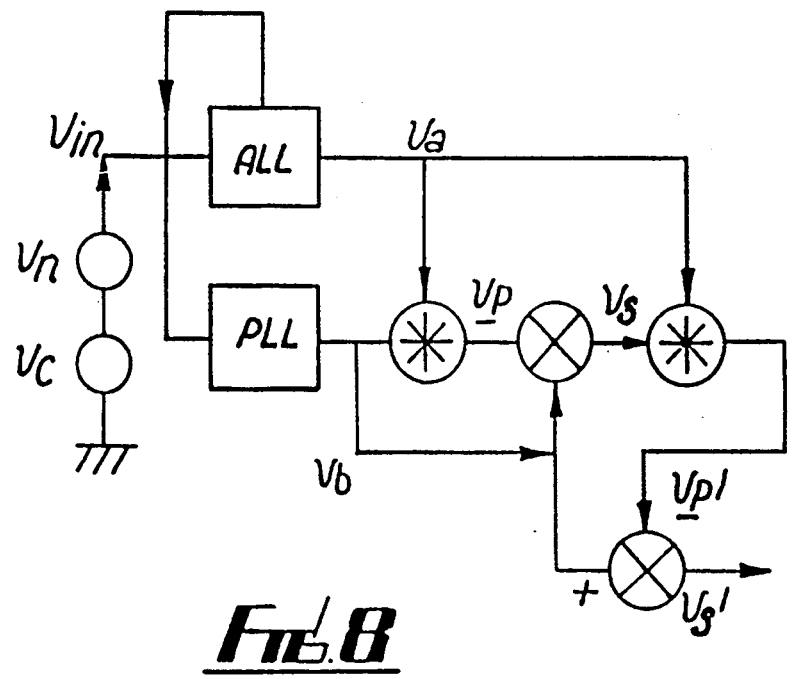
Fig. 8

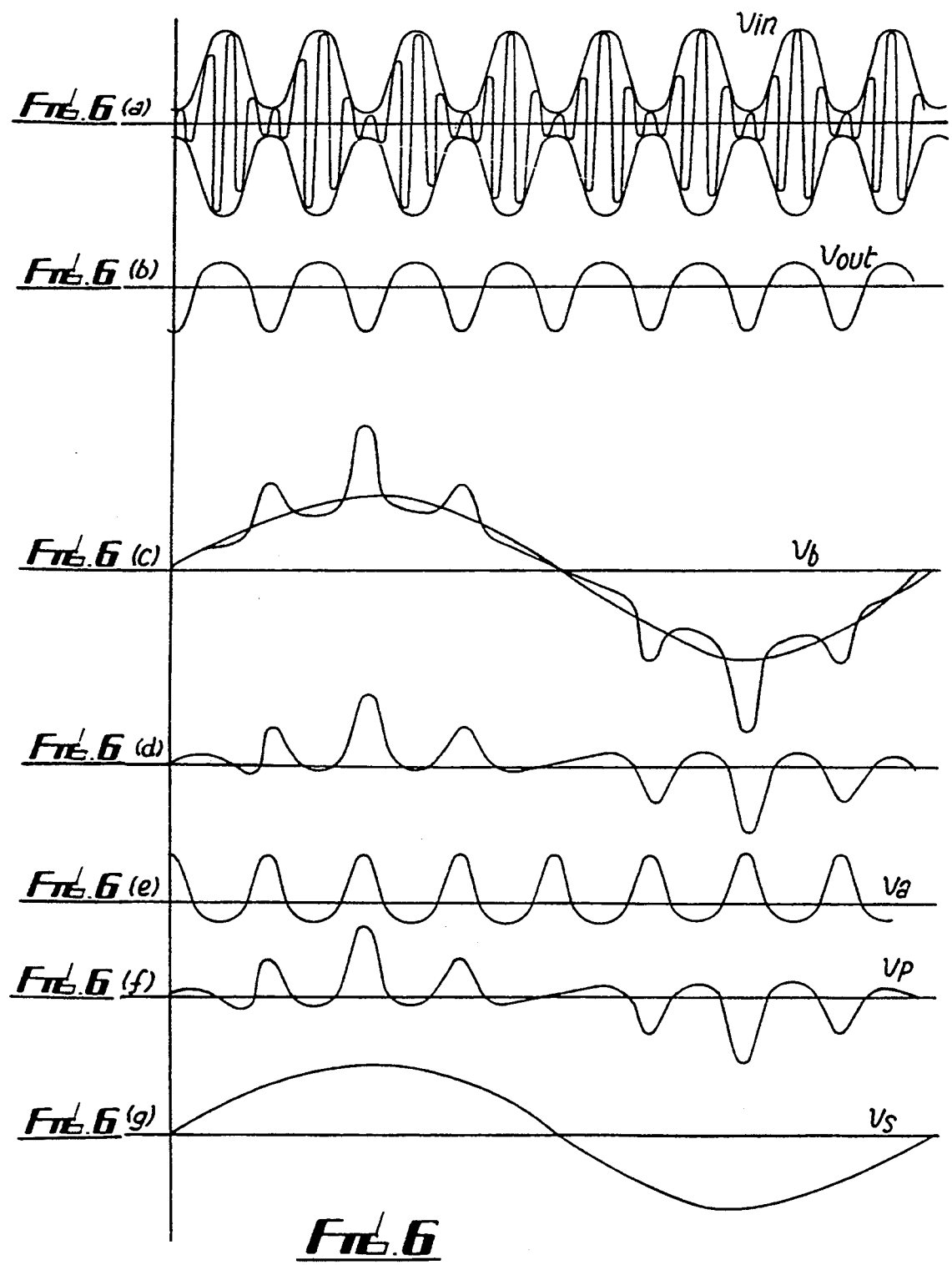

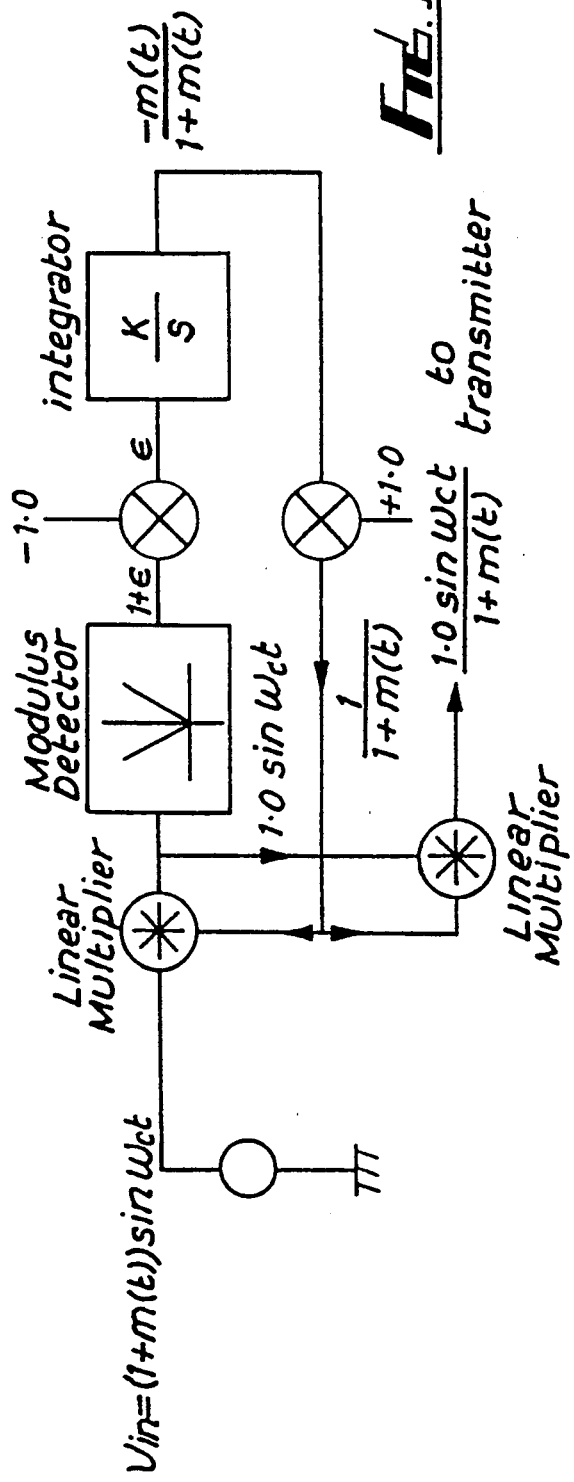
Fig. 13
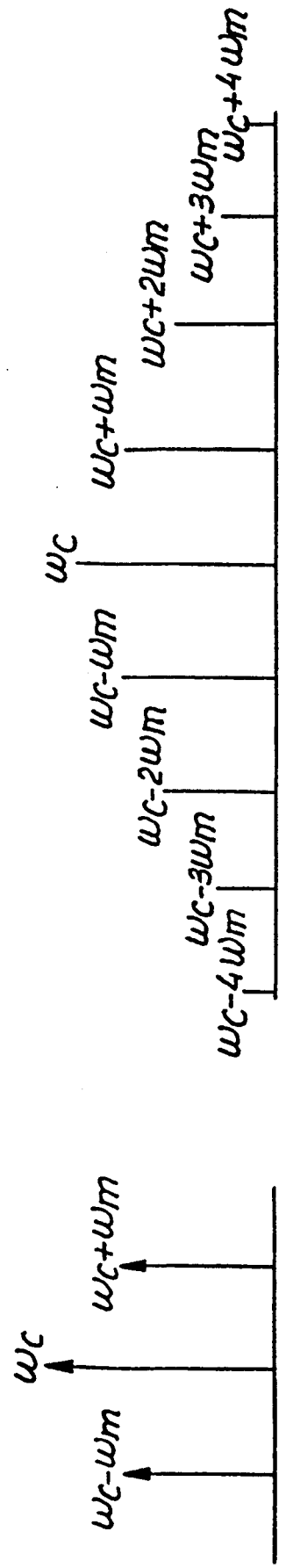
Fig. 14b
(b). Output spectrum showing multiple sideband amplitude modulation (MSB-AM)
Fig. 14a
(a) input spectrum

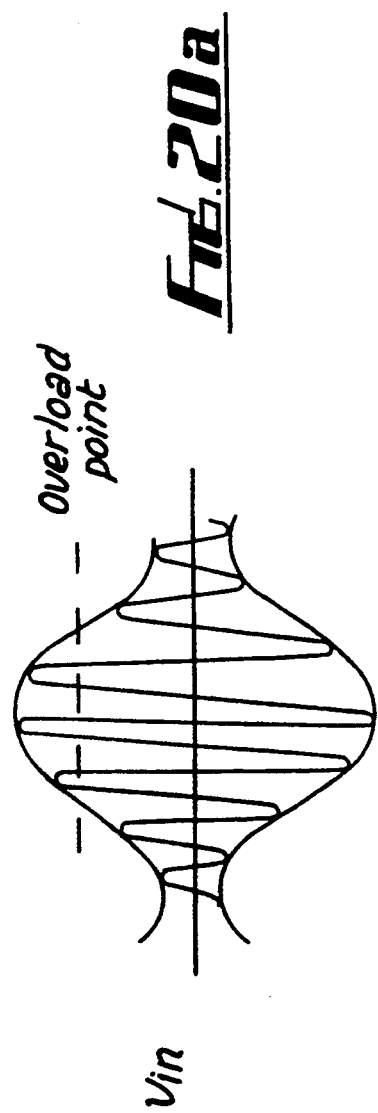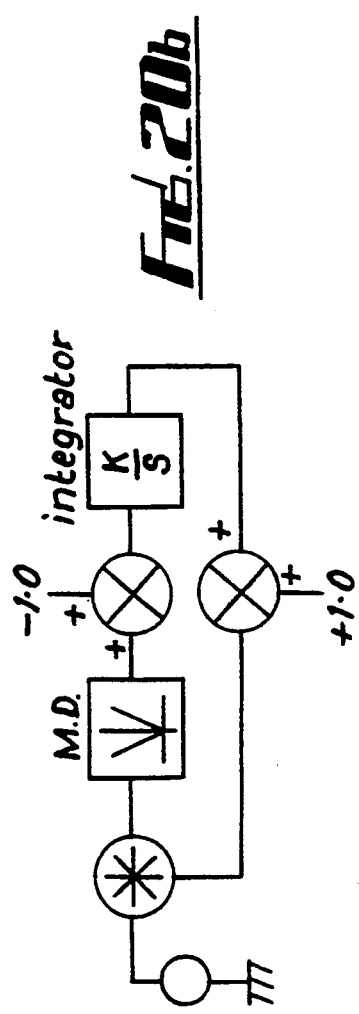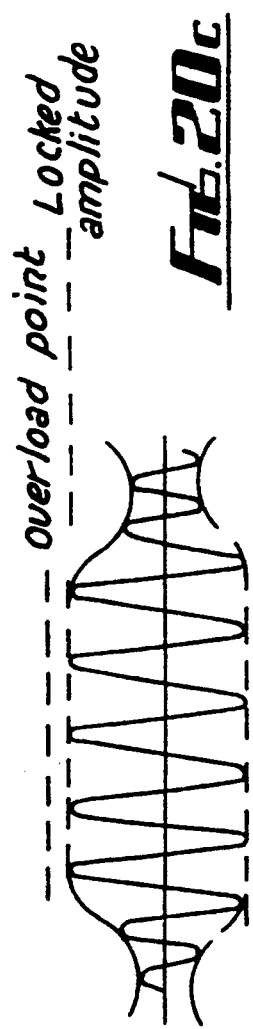

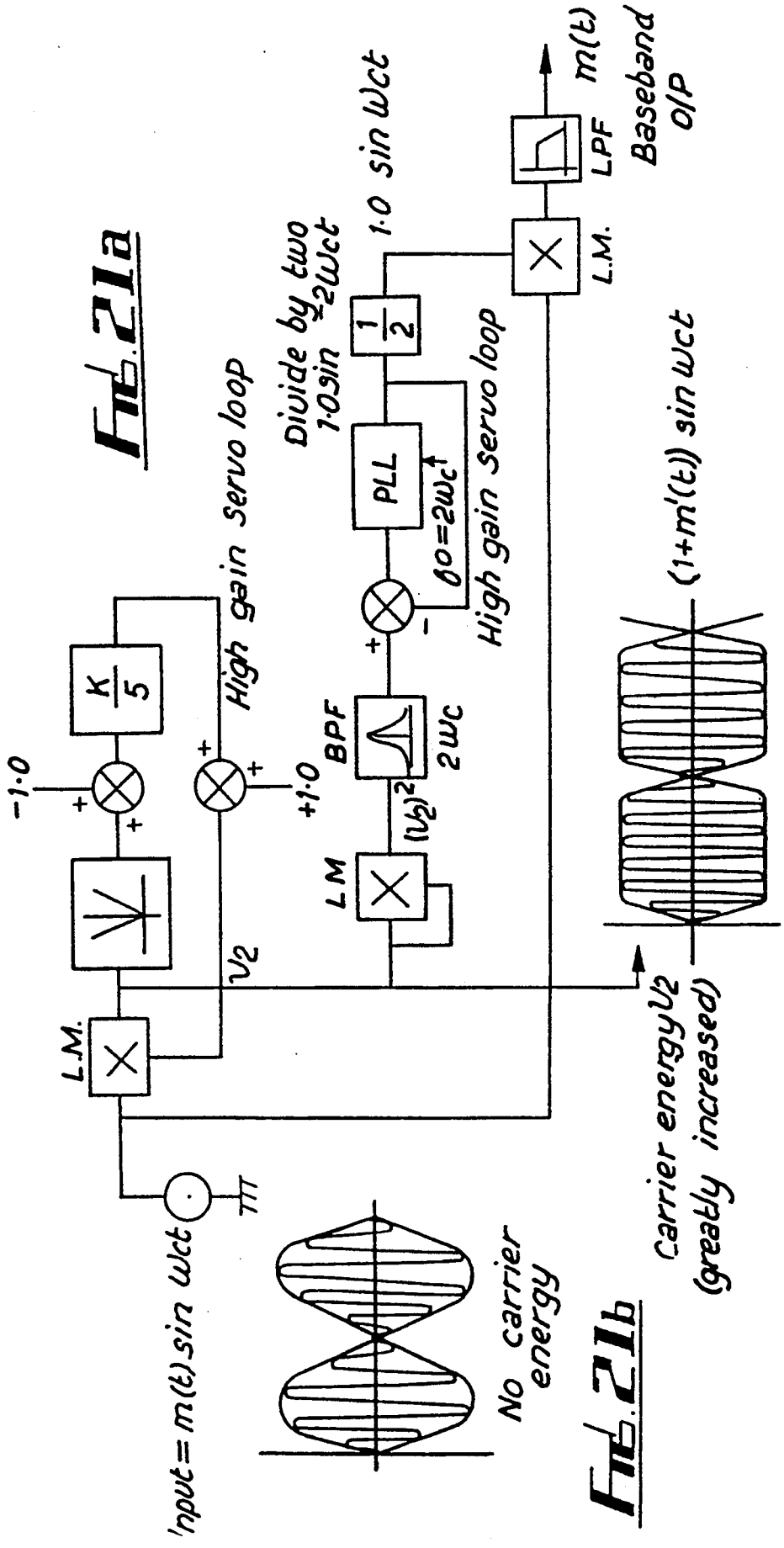

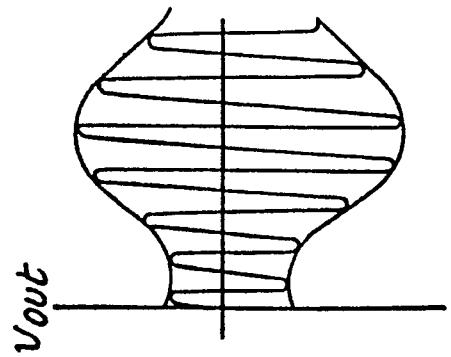
Fig. 22b
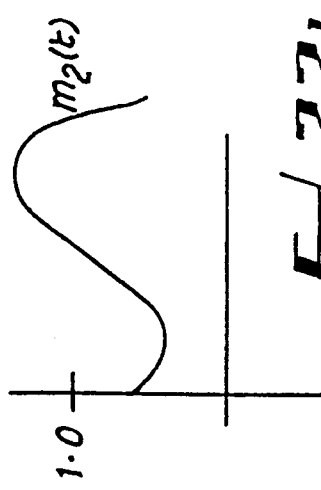
Fig. 22c
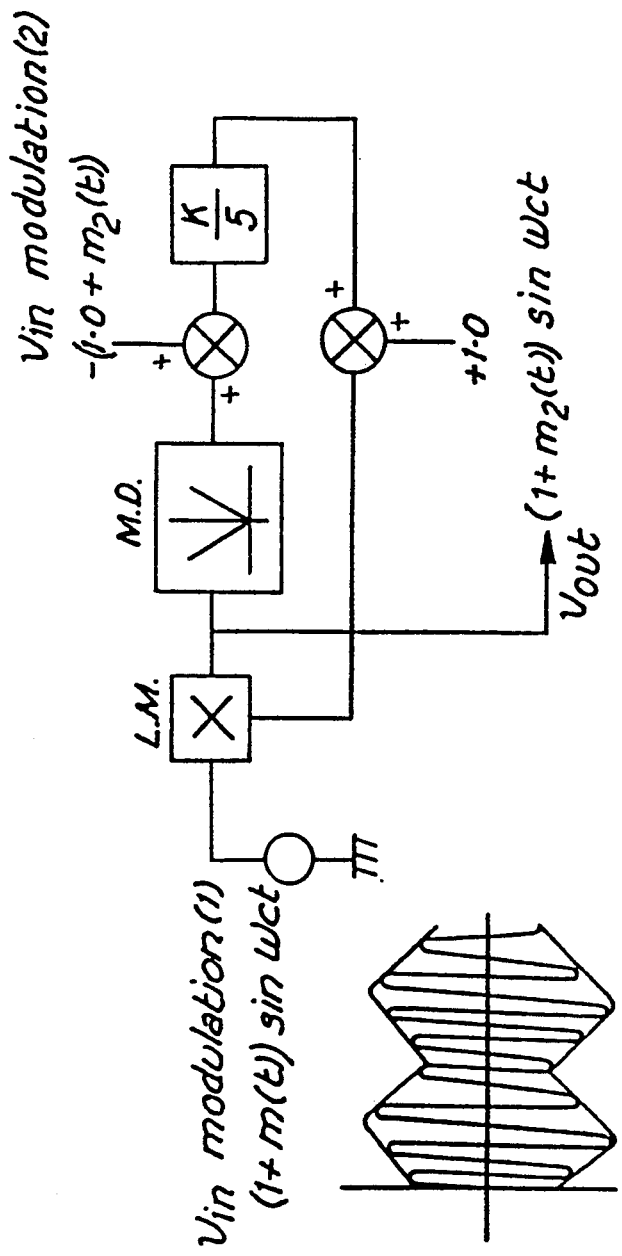
Fig. 22a
Fig. 22d

AMPLITUDE LOCKED LOOP CIRCUITS

This invention relates to electronic circuits, and more particularly to electronic circuits having loop-locked amplitude control.

In 1933 De Bellicise in France invented a category of circuitry generally called the Phase Locked Loop (PLL). Although a number of decades elapsed before the PLL was fully understood it is now used as a basic building block in many telecommunications, computer and consumer products. Two primary applications, for example, of the use of the PLL would be in the recovery of the data from all disc drives and for the recovery of audio signal from frequency modulated signals.

Similar to the PLL there is a category of circuitry called automatic gain control (AGC) which was invented in the mid-twenties of this century. Although AGC has been applied for many years it has never been fully explained in a clear analytical manner—many of the papers and patents being based on an ad-hoc approach to design problems associated with this circuitry.

This invention concerns a new category of circuitry which will be hereafter referred to as the Amplitude Locked Loop (ALL) since it embodies all the principles of the PLL but operates in the amplitude domain or real domain and not in the frequency or imaginary domain. The ALL will be described as the dual of PLL.

According to the present invention there is provided an electronic circuit having loop-locked amplitude control, said circuit comprising a voltage-controlled amplifier coupled to receive a circuit input signal and a feedback signal, a modulus detector whose input is coupled to the output of the voltage-controlled amplifier, and an integrator whose input is coupled to the output of the modulus detector, the output of the integrator being coupled to the voltage-controlled amplifier to deliver said feedback signal thereto, whereby said electronic circuit forms an amplitude locked loop with the output of the integrator providing the output signal of the circuit.

Said voltage-controlled amplifier is preferably constituted by a linear signal multiplier.

Said modulus detector is preferably constituted by a full-wave precision rectifier.

The output of the modulus detector is preferably coupled to the input of the integrator by way of a first level shifter functioning in use of the electronic circuit to set the quiescent point of the circuit to zero volts at the input of the integrator.

The output of the integrator is preferably coupled to deliver the feedback signal to the voltage-controlled amplifier by way of a second level shifter functioning in use of the electronic circuit as a level set point for the voltage-controlled amplifier.

According to a second aspect of the present invention there is provided a decoding circuit for FM signals comprising in combination an Amplitude Locked Loop and a Phase Locked Loop to give a "noise-alone" signal which is then subtracted from the output of the Phase Locked Loop to give an output signal.

According to a further aspect of the present invention there are provided a number of applications of Amplitude Locked Loop as hereinafter described.

As is well known, a PLL is a servo loop which is slaved or locked to the frequency of a given carrier and is independent of amplitude. By analogy, the ALL is a servo loop which is slaved or locked to the amplitude of a carrier and is independent of frequency.

Embodiments of the invention will now be described by way of example with reference to the accompanying drawings wherein:

FIG. 5 is a schematic block diagram of a conventional FM decoder;

Figure 7:
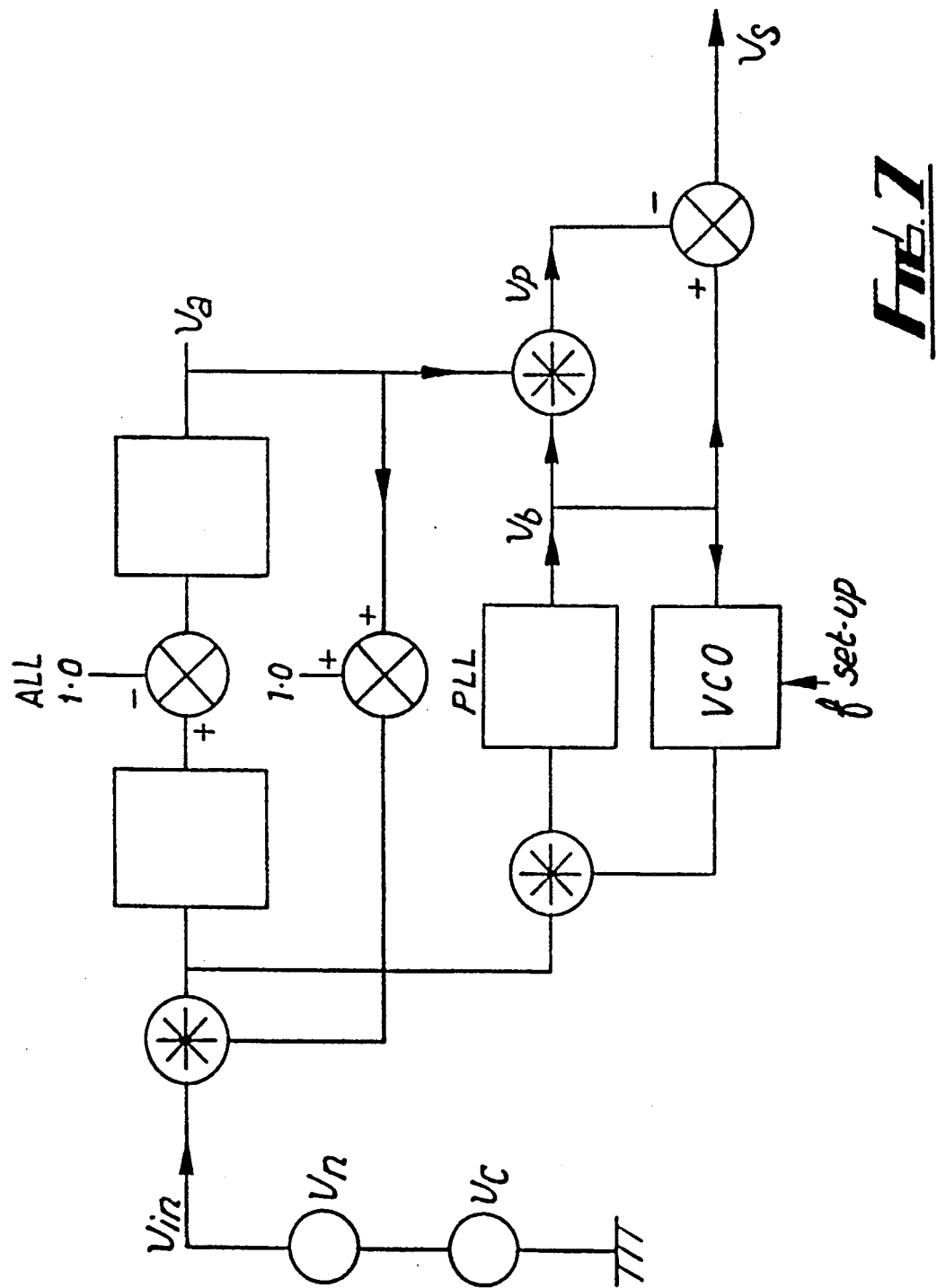
Figure 9:
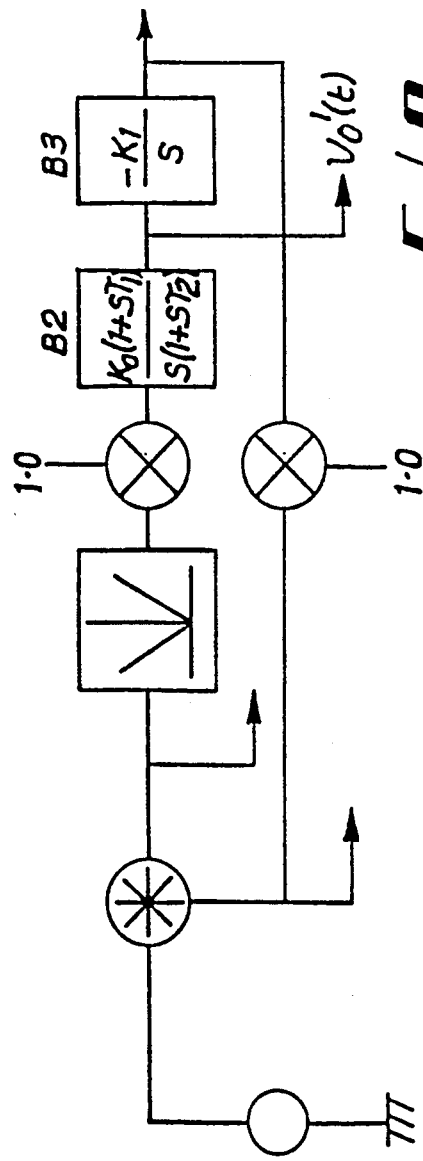
Figure 10:
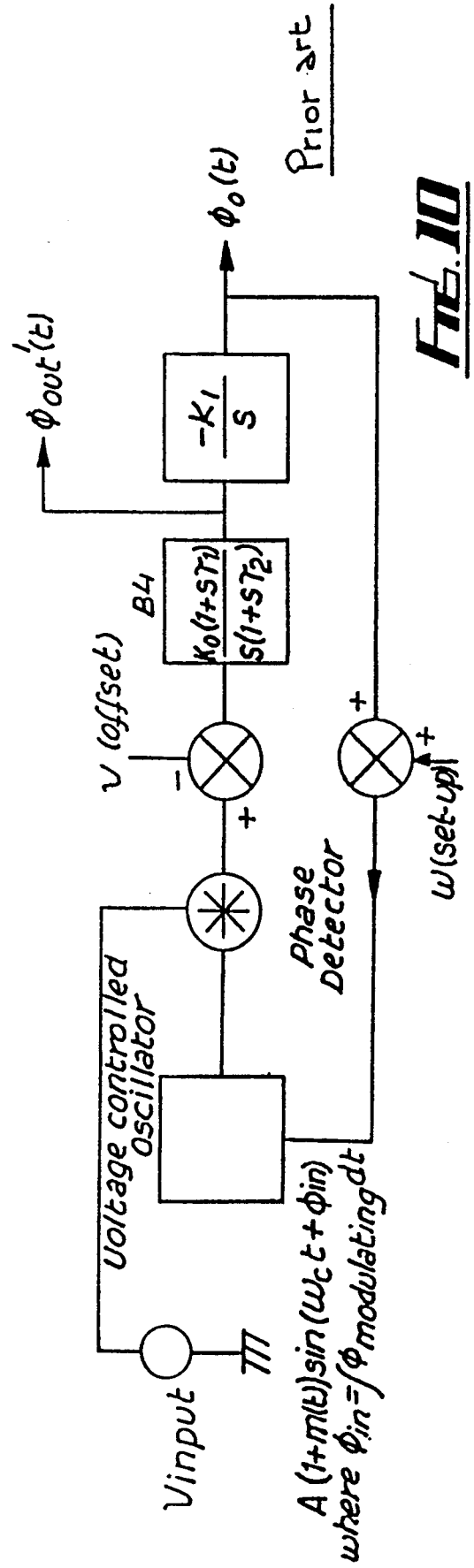
Figure 12:
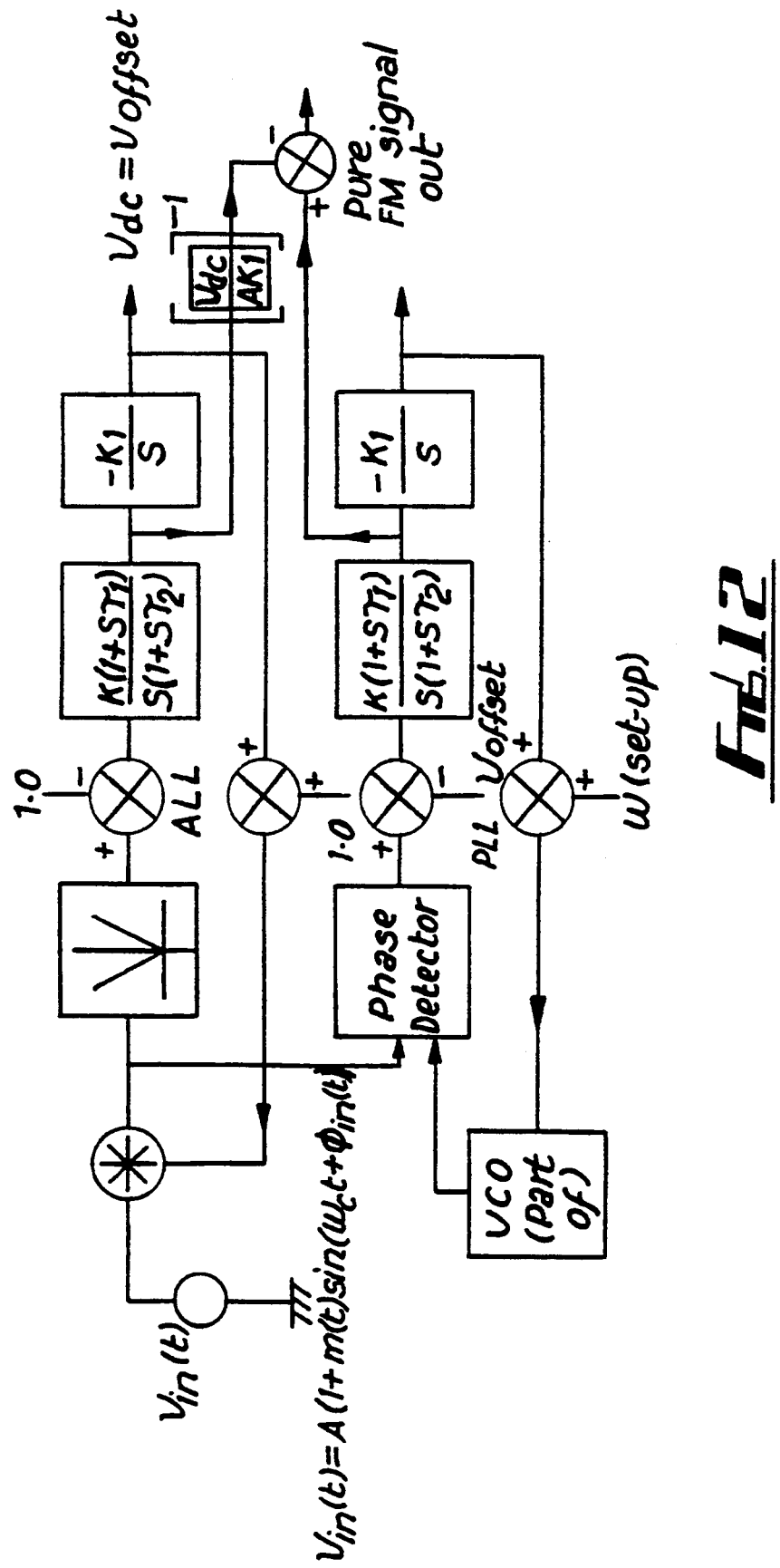

FIGS. 6(a) to 6(g) illustrate waveforms existing in FM decoding;

FIG. 7 is a block diagram of an FM decoder employing an Amplitude Locked Loop;

FIG. 8 is an improvement of the circuit of FIG. 7;

FIG. 9 is a block diagram of an enhanced Amplitude Locked Loop;

FIG. 10 is a block diagram of a conventional Phase Locked Loop;

FIGS. 11(a) to 11(e) illustrate waveforms of signals existing in Phase Locked Loop due to AM crosstalk;

FIG. 12 illustrates a circuit using an Amplitude Locked Loop and a Phase Locked Loop to remove AM crosstalk from an FM signal.

Figure 15:
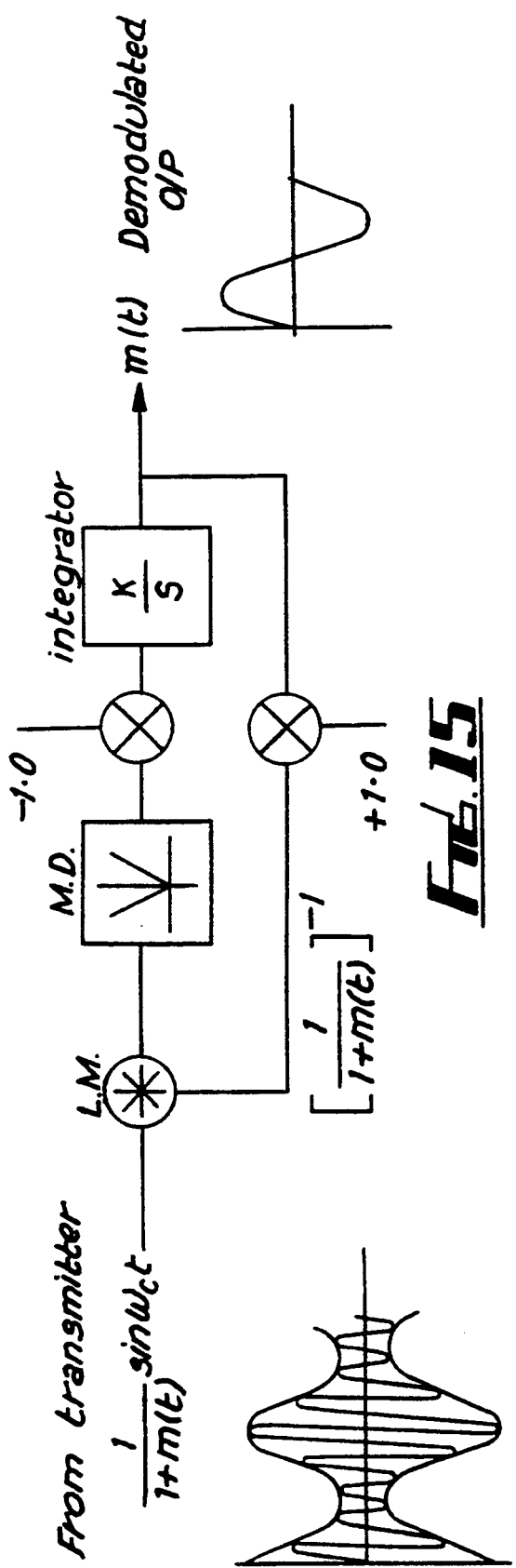
Figure 16:
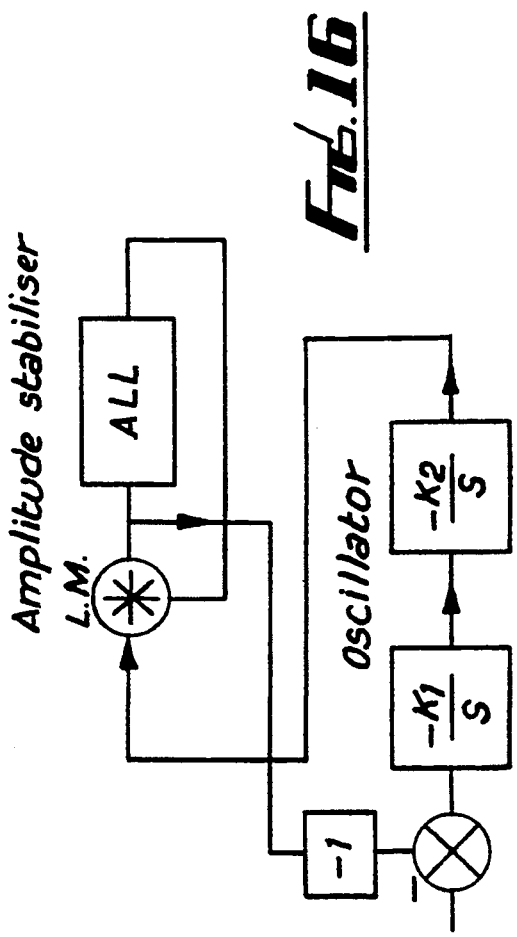
Figure 17:
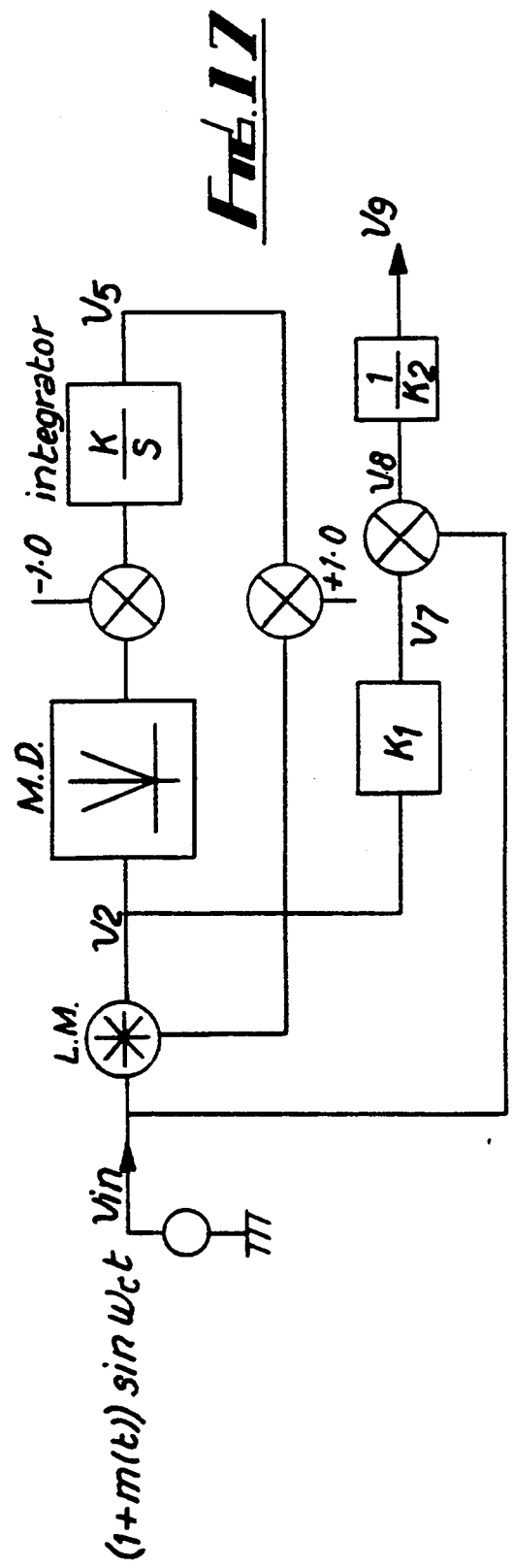
Figure 18:
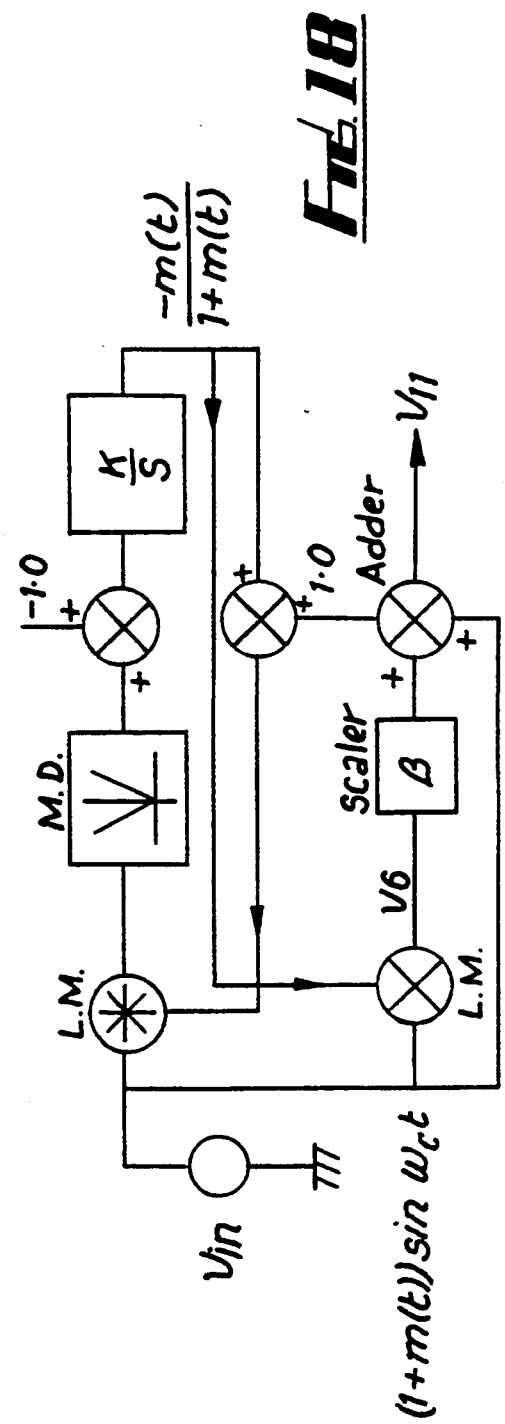
Figure 19:
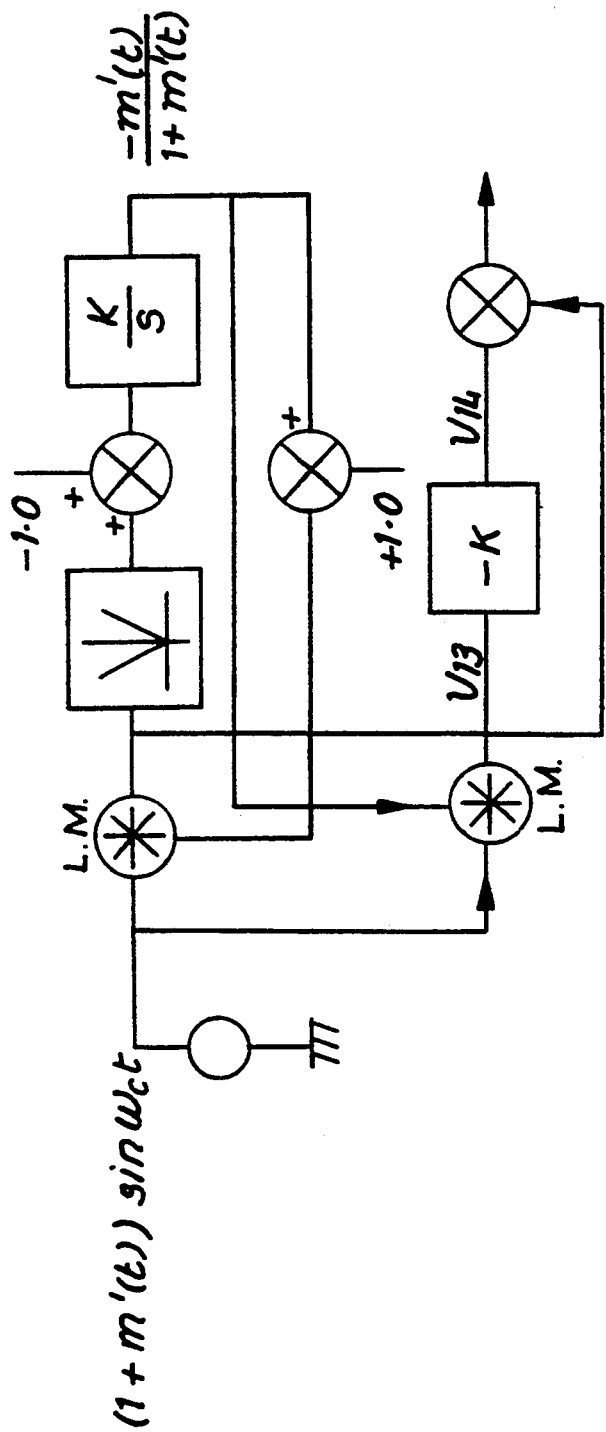

FIG. 13 is a block schematic diagram of the ALL circuit adapted for multiple sideband amplitude modulation (MSBAM);

FIGS. 14(a) and 14(b) are schematic diagrams of input and output amplitude/frequency spectra arising in operation of the MSBAM circuit of FIG. 13;

FIG. 15 is a block schematic diagram of the ALL circuit adapted for decoding the MSBAM produced by the circuit of FIG. 13;

FIG. 16 is a block schematic diagram of the ALL circuit adapted to form a high stability oscillator;

FIG. 17 is a block schematic diagram of the ALL circuit adapted for modulation index control by compression;

FIG. 18 is a block schematic diagram of an alternative adaptation of the ALL circuit for modulation index control by compression;

FIG. 19 is a block schematic diagram of the ALL circuit adapted for modulation index control by expansion;

FIGS. 20(a), 20(b) and 20(c) together relate to an adaptation of the ALL circuit to function as a high speed AC zener clamp, with FIG. 20(a) being an input signal amplitude/time waveform, FIG. 20(b) being a block schematic diagram of the adaptation of the ALL circuit, and FIG. 20(c) being an output signal amplitude/time waveform;

FIG. 21 is a block schematic diagram of a digital implementation of the ALL circuit; and FIG. 22 is a block schematic diagram of an adaptation of the ALL circuit to closed loop amplitude modulation.

Figure 1:
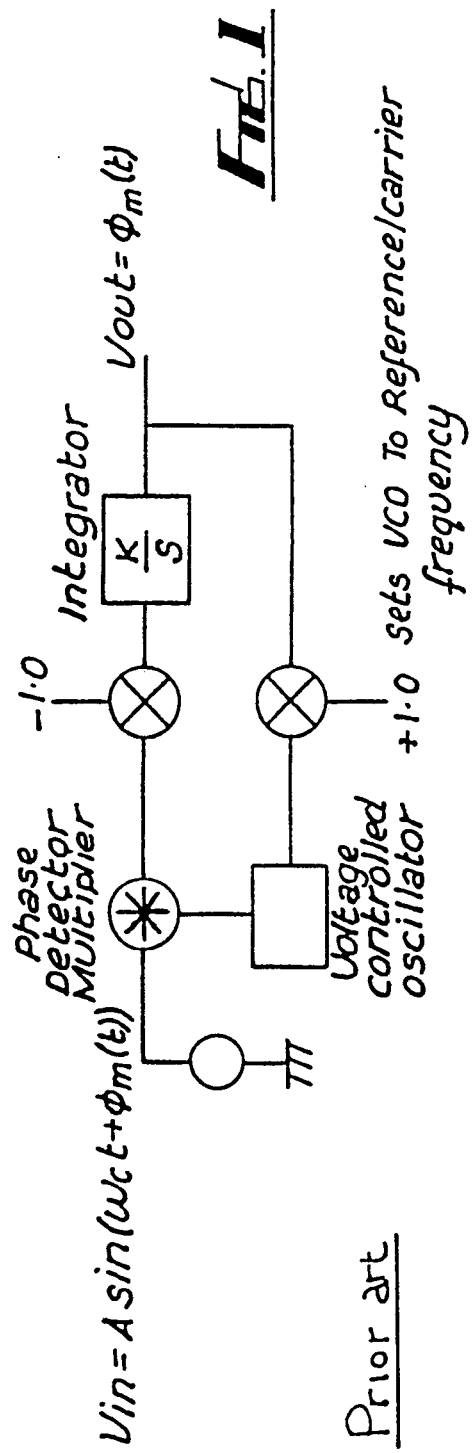
FIG. 1 is a block circuit diagram of a conventional phase locked loop (PLL) included for explanation only.

Referring first to FIG. 1 there is shown a block diagram of a conventional PLL.

On the assumption that frequency lock has taken place, and the incoming frequency is equal to the set point frequency, then the output of the Phase Detector PD will be its set value, say +1.00 volts. If the incoming frequency increases by df then the output voltage of the Phase Detector PD will also increase by dv. The high gain integrator will drive the voltage controlled oscillator VCO towards the incoming frequency and hence reduce the error signal back towards zero. This error signal is the demodulated output.

Figure 2:
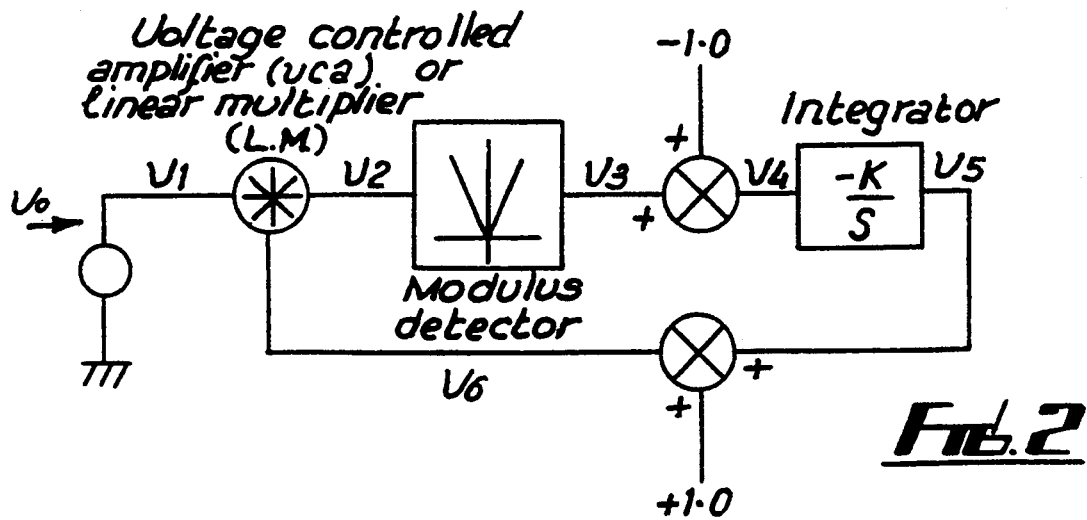
FIG. 2 is a block circuit diagram of an amplitude locked loop (ALL) in accordance with the invention.

An analogous process occurs in the ALL which is shown in FIG. 2.

There are five operating blocks in the ALL. The first is block which is a voltage controlled amplifier (VCA). This is in practice a linear multiplier.

The second block is modulus detector or full wave precision rectifier.

The third block is a level shifter in order to set the quiescent point of the circuits at zero volts at the input to the integrator.

The fourth block is an integrator in its basic form (it can be a double integrator with suitable phase advance compensation).

The fifth block is a level set point for the voltage controlled amplifier or multiplier.

Figure 3:
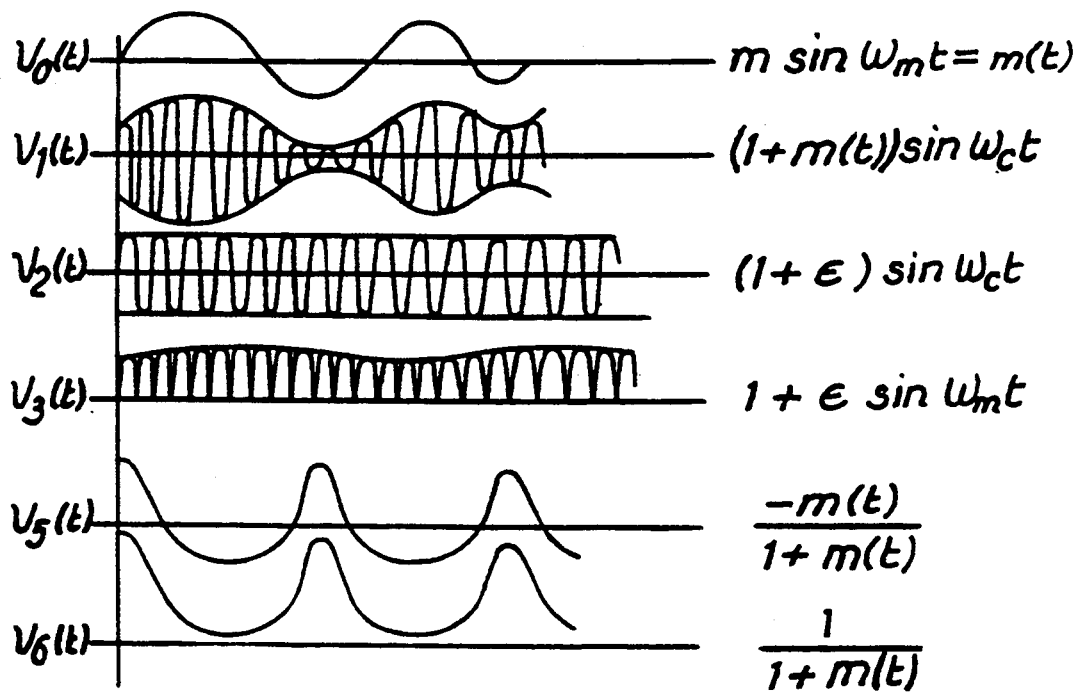
FIG. 3 is a waveform diagram of various voltages occurring in use of the ALL circuit of FIG. 2.

The circuit operation will be described with reference to the input voltage $V_1$ and the circuit voltages, $V_2$ to $V_6$ which are shown in FIG. 3.

Since the VCA is a multiplier then:

$$V_2 = V_1 \times V_6$$
$$= [1 + m(t)] \sin w_c t \times V_6$$

Therefore
$$V_3 = [(1+m(t)) \times (1+f(t))] \sin w_c t = [1+m(t)] \times [1+f(t)]$$

but
$V_3 = 1e$
Therefore $1+e = [1+m(t)][1+f(t)]$
If K>>1 the e is small ie virtual earth then
$1 = [1+m(t)][1+f(t)]$ Therefore
$$1 + f(t) = \frac{1}{1 + m(t)} = V_6$$

and so $$V_5 = \frac{1}{1 + m(t)} - 1$$
$$= \frac{1 - 1 - m(t)}{1 + m(t)}$$

Therefore
$$V_5 = \frac{-m(t)}{1 + m(t)}$$

Figure 4:
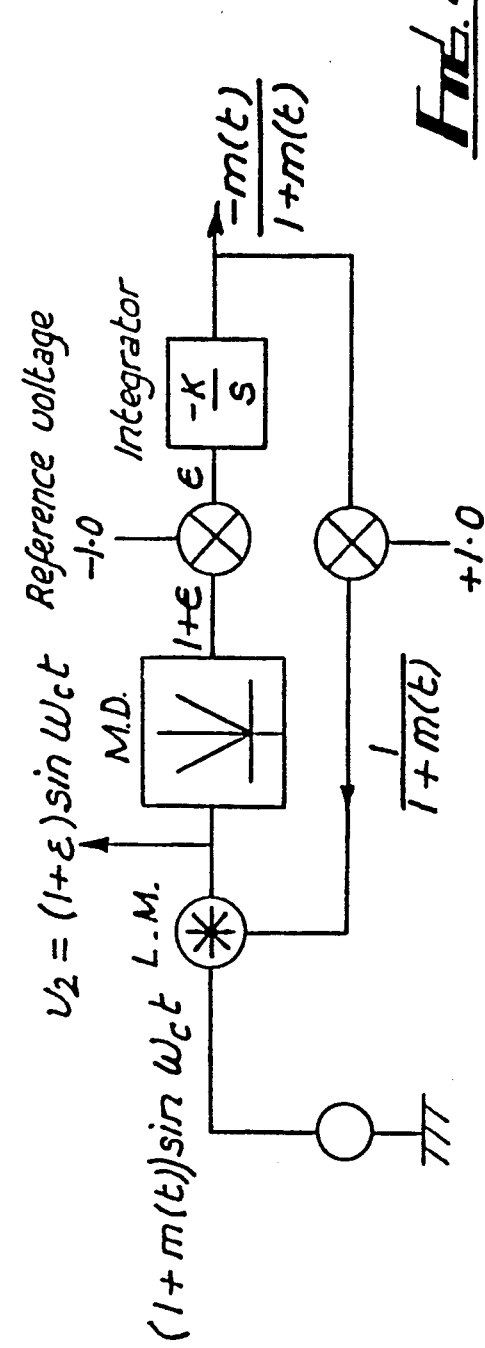
FIG. 4 is a modified presentation of the block circuit diagram of the ALL of FIG. 2

Thus the ALL may be redrawn as shown in FIG. 4.

Thus for an amplitude modulated carrier the following three output functions can be obtained.

At $V_2$ there is the pure unmodulated carrier, ie:

$V_2 = A \sin w_c t$

At $V_5$ there is the negative of the modulation index divided by $1+m(t)$ and at $V_6$ $$V_6 = \frac{1}{1 + m(t)}$$

there exists the reciprocal of $1+m(t)$ for all frequencies where K is much greater than unity.

None of the above three signals has been available in this form before the invention of the high gain Amplitude Locked Loop.

Referring now to FIGS. 5 to 8 there will be described the use of an Amplitude Locked Loop to recover frequency modulated signals which have been lost due to large additive noise.

In a radio communication system additive in-band noise causes the breakdown of the link by injecting large spikes into the decoded output which are extremely disturbing to the listener and eventually cause loss of intelligibility. This is more commonly known as the threshold effect. By using an Amplitude Locked Loop in combination with associated circuitry this breakdown mechanism can be minimised and the quality and range of FM radio transmission can be greatly improved. A basic FM receiver is shown schematically in FIG. 5 and comprises a conventional Phase Locked Loop/VCO feedback circuit.

Referring to FIG. 5, consider a fixed frequency FM carrier signal ($V_c$) to which is added a noise signal ($V_n$) in the form of a disturbing sine wave of similar frequency to the unmodulated carrier. The resulting signal is shown in FIG. 6(a) and this represents the FM signal ($V_{in}$) received by the receiver. This disturbance produces a rate of change of phase shown in FIG. 6(b) being a series of spikes of fixed frequency and amplitude.

If the FM carrier ($V_c$) frequency is now modulated or deviated from the unmodulated frequency, then the additive noise becomes multiplicative and the resultant demodulated output of the FM receiver ($V_{out}$) appears as shown in FIG. 6(c). The spikes which are superimposed on the FM demodulated signal are the disturbance referred to earlier.

As seen in FIG. 6(c), as the signal frequency deviates further from the center frequency, the frequency of the spikes and the amplitude of the spikes become larger, also the shape of the spike reverses as the deviation goes through zero. If the spikes were drawn without the demodulated FM signal they would appear as in FIG. 6(d).

A circuit which minimises this disturbance is illustrated in FIG. 7. The circuit comprises an Amplitude Locked Loop and a Phase Locked Loop to which there is input the received FM signal ($V_{in}$) (being the modulated FM signal ($V_c$) together with the additive noise signal ($V_n$)) shown in FIG. 6(a).

The output ($V_a$) of the Amplitude Locked Loop is illustrated in FIG. 6(c) and is multiplied by the output ($V_b$) of the Phase Locked Loop which is illustrated in FIG. 6(c) to give the signal ($V_p$) illustrated in FIG. 6(f).

It will be seen that the feedback signal ($V_a$) in the Amplitude Locked Loop has virtually the same shape as the spike noise of FIG. 6(d) but has constant amplitude and does not change sign as the signal deviation goes through zero.

Due to this similarity between the signal ($V_p$) of FIG. 6(f) and the signal of FIG. 6(d) there has been obtained at the output of the multiplier of the circuit of FIG. 7 a signal ($V_p$) which is the noise or spike signal by itself or the "noise alone" signal. After suitable scaling, the "noise alone" signal ($V_p$) can be subtracted from the original Phase Locked Loop output ($V_b$) (which is the demodulated signal plus noise) leaving a "pure" signal ($V_s$). The result of this subtraction is shown in FIG. 6(g).

The intelligibility of the waveform of FIG. 6(g) is much higher than the unfiltered waveform and in some cases intelligence can be recovered from signals which have been completely lost.

Further, this process can be repeated using the circuit of FIG. 8, multiplying signal ($V_s$) with the Amplitude Locked Loop output signal ($V_a$) and subtracting this cleaner noise signal $V_p'$ from the original Phase Locked Loop signal to give a further enhanced output $V_s'$.

Referring now to FIGS. 9 to 12 there is described a circuit for decoding a combined amplitude and frequency modulation signal. Hitherto, for reasons explained hereafter, it has been considered impractical to combine amplitude modulation and frequency modulation since mutual interference would occur in the demodulation process.

By employing an Amplitude Locked Loop (ALL) a new set of circuit techniques can now be implemented in order to eliminate the cross-product terms and in so doing eliminate multiplication noise in frequency modulation systems including radio transmission, disc drive signals, and video instrumentation recorder circuitry—other applications can be in domestic, industrial, military and space telecommunications.

As has been described, an Amplitude Locked Loop (ALL) is a servo feedback circuit which uses a linear multiplier controlled by an error signal to eliminate or divide out the amplitude modulation in the incoming signal and thus recover the pure unmodulated sine wave-carrier free of any sideband, without the use of any resonant circuitry.

A block diagram of an ALL is shown in FIG. 2, and a more sophisticated version of the ALL is shown in FIG. 9.

In the form of FIG. 9, the simple integrator block of the FIG. 2 circuit has been replaced by two integrator blocks. The first, B2, contains the necessary lag-lead compensation to ensure stability at the unity gain crossing whilst the second, block B3, is a pure integrator. The input voltage to the integrator is then the pure differentiation of the output. This is shown as $V_o'(t)$.

It is now of interest to compare the phase locked loop (PLL) using the same model. This is shown in FIG. 10.

The PLL is drawn in a new manner in order to identify the similarities to the ALL. The phase detector at the input is identical to the modulus detector in the ALL. An offset voltage $V_{offset}$ is deliberately inserted at the output of the phase detector. This voltage is small but is non-zero. Block B4 consists of an integrator with a suitable lag-lead network to ensure stability. The output of block B4 is the normal output of the PLL. The block B5 is the pure integrator which is usually internal to the voltage controlled oscillator. Although the parameter $\phi_{out}(t)$ can never be observed it is real and does exist.

If amplitude modulation is combined with frequency modulation an extra additive term appears at the output of B4 which is the phase detector output after some filtering. This can be described for an input AM/FM signal, $V_{in}$ as $$V_{in} = A[1 + m(t)] \sin(w_c t + \phi_{in})$$

where

-continued $$\phi_{in} = \int \frac{dt}{\phi \text{ modulating}}$$

$$\frac{d\phi_{out}(t)}{dt} = \frac{d\phi_{in}}{dt} + \frac{1}{K_1} \frac{d}{dt}\left(\frac{V_{offset}}{[1 + m(t)]A}\right)$$

Figure 11:
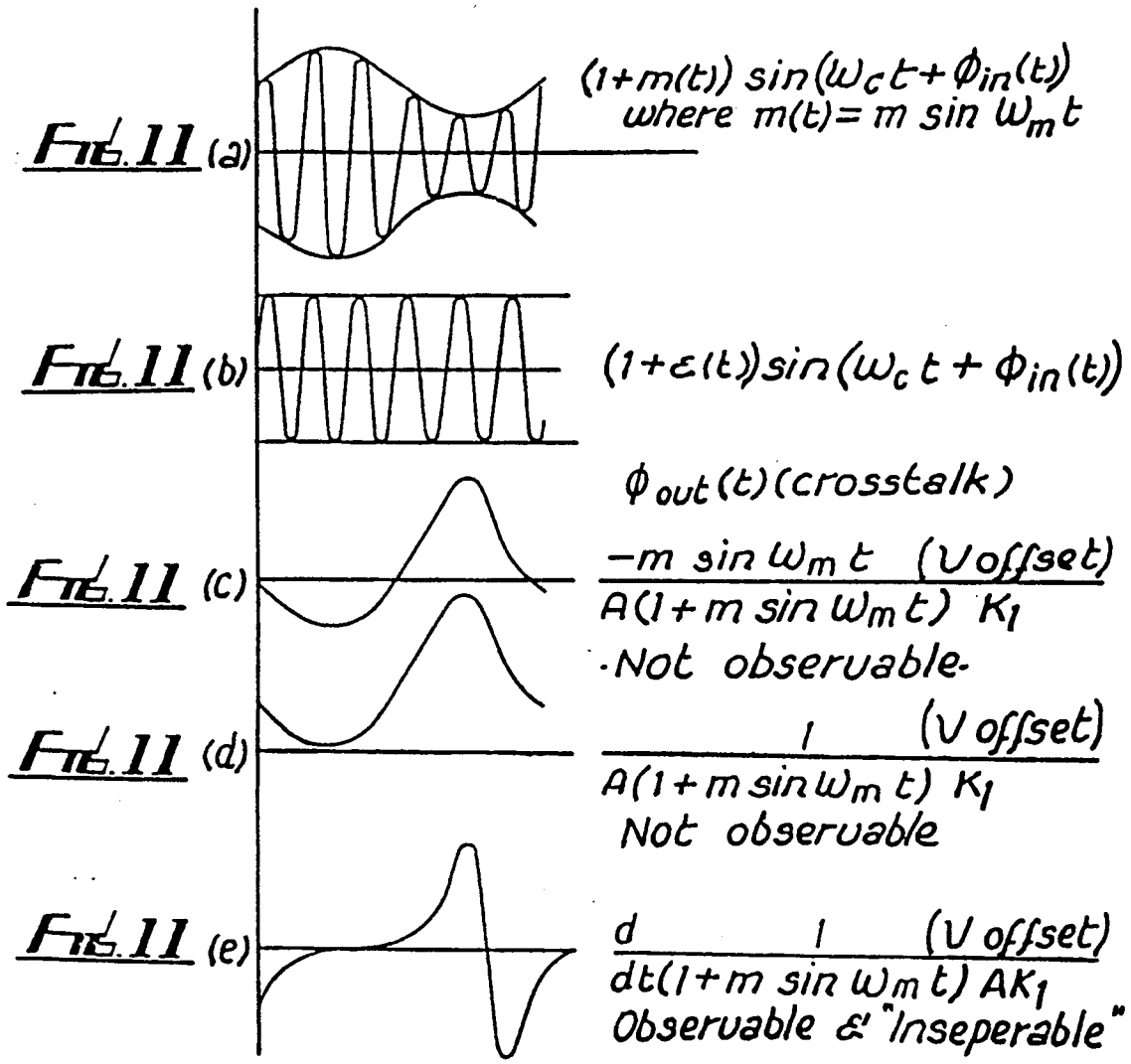

Since $\phi_{in}$ in is by definition the integral of the FM signal this term represents the FM signal demodulated. The second term can be described as the rate of change of the offset voltage ($V_{offset}$) divided by the input amplitude $[1+m(t)]A$ and the integrator constant. The relevant waveforms are shown in FIG. 11.

The waveform in FIG. 11(e) is observed in practice and is mixed with the desired FM signal and has hitherto been inseparable. It is a highly distorted version of the AM modulation and is highly disturbing to the listener compared to, say, white noise. It is this cross-talk problem which has previously rendered AM and FM incompatible.

By implementing a circuit which incorporates an ALL this cross-talk can be eliminated.

Referring now to the block diagram of the ALL in FIG. 9, the output $V_o'(t)$ is shown to be equal to $$\frac{d}{dt}\left(\frac{-m(t)}{1 + m(t)}\right)$$

this function is, in fact, identical to $$\frac{d}{dt} \frac{1}{1 + m(t)}$$

In turn, this is equivalent to the distortion term shown in FIG. 11(e), multiplied by a scaling factor of $$\frac{V_{offset}}{AK_1}$$

when the general term $m(t)$ is replaced by $m \sin w(t)$. Note that this term is independent of frequency or phase.

Thus, by subtracting the output of block B2 in the ALL from the output of the PLL block B4 the cross-talk term is effectively eliminated. Furthermore the ALL itself reduced the original cross-talk being presented to the PLL by "pre-filtering" of the amplitude modulation.

A block diagram of one embodiment of the circuit of the invention is shown in FIG. 12.

For example, if inverse amplitude modulation, is used then the system may be used for transmitting stereo signal since these cross-products contain no distortion terms since the cross product is $$V_{cp} = \frac{d}{dt}\left(\frac{1}{K_1 A}[1 + m(t)]\right)$$

$$= \frac{m'(t)}{K_1 A}$$

This is the major advantage of multiple sideband amplitude modulation.

There has thus been described an electronic circuit functioning in use as an amplitude locked loop.

There will now be described practical applications of the above-described amplitude locked loop (hereinafter referred to as an 'ALL'), the applications of the ALL being circuits for various forms of electronic signal processing.

(1) Multiple Sideband Amplitude Modulation (MSBAM)

Multiple Sideband Amplitude Modulation is not previously known since only one pair of sidebands exists in normal amplitude modulation unlike FM which relies on multiple sidebands to produce the improvement in signal to noise ratio.

Using an ALL, inverse amplitude modulation is now feasible. In FIG. 13 is shown MSBAM with its spectrum in FIG. 14.

Thus the modulation energy is spread throughout a much wider spectrum say five times the maximum modulating frequency.

To decode this modulation the received signal is presented directly to the ALL and decodes without further processing, ie see FIG. 15.

The white noise in the bandwidth will be uncorrelated whereas the signal power is directly correlated—the greater the modulation index the greater the protection against noise sources and the improvement over normal amplitude modulation. These characteristics are similar, if not identical, to frequency modulation.

(2) High Stability Oscillators

Highly stable oscillators require very high 'Q' crystals to maintain the accuracy and stability. The classic example is that of the oscillator accuracy required to recover the colour carrier in a television set. This oscillator uses a crystal which must be accurate to one part to ten to the power six.

The ALL may be used to stabilise an oscillator as shown in FIG. 16.

Since the phase shift is 90° at all frequencies through the two integrators the frequency of oscillation will be determined by the frequency at which the product of the two time constants equals unity ie, $fo_1 \times fo_2$. The second criterion for stability is that the gain must be held at unity to say six or more decimal places.

This can now be easily achieved with an ALL especially at low frequencies. The gain of integration at 1HZ could be easily maintained at 10 to power 12 giving perhaps six orders of magnitude improvement on the existing crystal technology.

(3) Modulation Index Control

(a) Compression.

The ALL may be used to adjust the modulation index of an existing modulated signal. This circuit is shown in FIG. 17.

$V_{in} = [1 + m(t)] \sin w_c t$ $V_2 = \sin w_c t$ $v_7 = K_1 \sin w_c t$ $V_8 = [1 + m(t)] \sin w_c t + K_1 \sin w_c t$
$= (1 + K_1) \sin w_c t + m(t) \sin w_c t$ -continued $V_9 = \frac{1 + K_1}{K_2} [\sin w_c t] + \frac{m(t)}{K_2} \sin w_c t$ If $K_2 = 1 + K_1$ then $V_9 = 1 + \left(\frac{m(t)}{K_2}\right) \sin w_c t$ for example if $m = 0.5$ and $K_1 = 9$ and $K_2 = 10$ then $V_9 = \left(1 + \frac{0.5(t)}{10}\right) \sin w_c t$
$= [1 + 0.05(t)] \sin w_c t$ Thus the modulation index has been reduced by a factor 10.

Another procedure for achieving the same result is to use $V_5$ $V_5 = \frac{-m(t)}{1 + m(t)}$ multiply $V_5$ and $V_{in}$ to give $V_{10} = V_5 V_{in} = \frac{-m(t)}{1 + m(t)} [1 + m(t)] \sin w_c t$
$= -m(t) \sin w_c t$ A fraction of this sideband is then added to the original input giving $V_{11} = 1 + m(t)] \sin w_c t - B \, m(t) \sin w_c t$ If $B = 0.9$ then $V = [1 + m(t)(1 - .91)] \sin w_c t$
$= \left(\frac{1 + m(t)}{10}\right) \sin w_c t$ which is the same result as before.

The circuit diagram is shown in FIG. 18.

(b) Expansion

The modulation index can similarly be expanded. This process is shown in FIG. 19.

$V_{13} = -m'(t) \sin w_c t \frac{[1 + m'(t)]}{[1 + m'(t)]}$
$= -m't \sin w_c t$ $V_{14} = K \, m'(t) \sin w_c t$ $V_{12} = \sin w_c t$ V out $= Km't \sin w_c t + \sin w_c t$
$= [1 + K'(t)] \sin w_c t$ If K=10 then the original modulation index can be recovered.

Note that this type of signal processing uses the ability of the ALL to separate out the carrier from the two sidebands and remix them in any desirable proportion.

(4) The ALL as a High Speed AC Zener Clamp

The ALL can be used simply as a high speed AC claim similar to the clamping action of a zener diode for DC values.

This could be of great value in the recording of compact disc where a headroom of some 14 decibels is set aside to avoid any chance of hard distorted overload. This is shown in FIGS. 20(a)–20(c).

Note that the "saturated" or locked amplitude is still sinusoidal and distortion-free. This application is extremely beneficial in live recording where the dynamic range of the incoming signal is unknown. It is also very beneficial in acoustic surveillance since speech can be made to have a flat envelope which greatly enhances intelligibility in adverse conditions.

(5) Carrier Recovery from a Suppressed Carrier Double Sideband Signal without needing a Pilot Sub-Carrier.

FIG. 21 shows how the ALL may be used to re-generate the suppressed carrier from a DS-SC AM signal without the need for a pilot tone sub-carrier.

(6) Closed Loop Amplitude Modulation (CLAM) and Modulation Replacement

The ALL may be used as a high quality distortion-free modulator simply by presenting the carrier at the input to the LM and modulating the reference at the MD output. Further, an incoming modulated signal can be suppressed and the modulation replaced by a new modulation signal. This is shown in FIG. 22.

We claim:

1. An electronic circuit having loop locked amplitude control, said circuit comprising:
a voltage controlled amplifier in the form of a linear signal multiplier having an input to receive a circuit input signal and an input to receive a feedback signal;
a modulus detector in the form of a full wave rectifier having zero output impedance and wide bandwidth, an input of said modulus detector being coupled to an output of said voltage controlled amplifier;
an integrator in the form of a linear integrator, an input of which is coupled to an output of said modulus detector, an output of said linear integrator being coupled to said voltage controlled amplifier to deliver said feedback signal thereto;
a first level shifter for coupling said output of said modulus detector to said input of said integrator and functioning in use of the circuit to set the quiescent point of the circuit to zero volts at said input of said integrator; and
a second level shifter for coupling said output of said integrator to said feedback input of said voltage controlled amplifier to deliver said feedback signal thereto and functioning in use of the electronic circuit as a level set point for the voltage controlled amplifier;
said electronic circuit forming an amplitude locked loop with an output of the integrator providing an output signal of the circuit.

2. A decoding circuit for FM signals comprising an electronic circuit as claimed in claim 1, and a phase locked loop circuit, an output of said electronic circuit being combined with an output for the phase locked loop to give a decoded FM signal.

* * * * *